§ United States Patent  
Jang et al.

(10) Patent No.: US 7,683,404 B2  
(45) Date of Patent: Mar. 23, 2010

(54) STACKED MEMORY AND METHOD FOR FORMING THE SAME

(75) Inventors: Young-Chul Jang, Yongin-si (KR); Won-Seok Cho, Suwon-si (KR); Jae-Hoon Jang, Seongnam-si (KR); Soon-Moon Jung, Seongnam-si (KR); Hoo-Sung Cho, Yongin-si (KR); Jong-Hyuk Kim, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 108 days.

(21) Appl. No.: 11/709,234

(22) Filed: Feb. 22, 2007

(65) Prior Publication Data  
US 2008/0067573 A1 Mar. 20, 2008

(30) Foreign Application Priority Data  
Sep. 14, 2006 (KR) ...................... 10-2006-0089314

(51) Int. Cl.  
H01L 25/065 (2006.01)

(52) U.S. Cl. ............... 257/211; 257/202; 257/E25.013; 365/185.17; 438/109

(58) Field of Classification Search ................. 257/202, 257/211, E25.013; 365/185.17; 438/109  
See application file for complete search history.

(56) References Cited

U.S. PATENT DOCUMENTS 7,327,590 B2 * 2/2008 Matsui et al. ................. 365/51

| | | | |
|---|---|---|---|
| 7,521,353 B2 * | 4/2009 | Petti | ............................ 438/623 |
| 7,553,611 B2 * | 6/2009 | Chen et al. | ................... 430/394 |
| 7,589,375 B2 * | 9/2009 | Jang et al. | .................... 257/316 |
| 2003/0119212 A1 * | 6/2003 | Nishihara et al. | .............. 438/3 |
| 2003/0223292 A1 * | 12/2003 | Nejad et al. | ................. 365/200 |
| 2005/0122771 A1 * | 6/2005 | Chen | .......................... 365/163 |
| 2006/0071074 A1 * | 4/2006 | Konevecki et al. | .......... 235/454 |
| 2006/0108627 A1 | 5/2006 | Choi et al. | |
| 2006/0125017 A1 * | 6/2006 | Liu | ............................. 257/365 |
| 2006/0171224 A1 * | 8/2006 | Nejad et al. | ................. 365/205 |
| 2007/0132049 A1 * | 6/2007 | Stipe | ........................... 257/421 |
| 2009/0046501 A1 * | 2/2009 | Ranjan et al. | ............... 365/171 |

FOREIGN PATENT DOCUMENTS

| | | |
|---|---|---|
| JP | 11-145431 | 5/1999 |
| JP | 2002-026283 | 1/2002 |
| JP | 2002-026283 A | 1/2002 |
| JP | 2002-368140 A | 12/2002 |
| JP | 2002-368141 | 12/2002 |
| KR | 10-2006-0057821 | 5/2006 |

* cited by examiner

Primary Examiner—Victor A Mandala  
(74) Attorney, Agent, or Firm—Lee & Morse, P.C.

(57) ABSTRACT

A stacked memory includes at least two semiconductor layers each including a memory cell array. A transistor is formed in a peripheral circuit region of an uppermost semiconductor layer of the at least two semiconductor layers. The transistor is used to operate the memory cell array.

20 Claims, 12 Drawing Sheets

STACKED MEMORY AND METHOD FOR FORMING THE SAME

CROSS-REFERENCE TO RELATED APPLICATIONS

This U.S. application claims benefit of foreign priority to Korean Patent Application No. 2006-89314, filed on Sep. 14, 2006, the disclosure of which is hereby incorporated herein by reference in its entirety.

BACKGROUND OF THE INVENTION

1. Field of the Invention

The present invention relates to a semiconductor device and a method for forming the semiconductor device. More particularly, the present invention relates to a stacked memory and a method for forming the stacked memory.

2. Description of the Related Art

Memories are used in various products such as mobile products, computers, and portable products. A typical memory device includes memory cells arranged two-dimensionally on a substrate. Customers want high-capacity, high-performance, and inexpensive memory devices, but it may be difficult to satisfy such demands with memory devices that only have two-dimensionally arranged memory cells.

For this reason, highly integrated memories having a multi-level or three-dimensional memory cell array structures have been proposed. In a multi-level memory cell array structure, memory cell arrays are vertically stacked on a substrate. A NAND flash memory may include NAND strings in which memory cells are connected in series, which may allow integration at a higher level than other types of memories. For this reason, flash memories having a multi-level array structure (stacked memories) are being actively studied. However, the stacked memories should be further studied for high reliability.

SUMMARY OF THE INVENTION

The present invention is therefore directed to a stacked memory and method for forming the same, which substantially overcome one or more of the problems due to the limitations and disadvantages of the related art.

At least one of the above and other features and advantages of the present invention may be realized by providing a stacked memory of at least two semiconductor layers. Each of the semiconductor layers may include a memory cell array and a transistor in a peripheral circuit region of an uppermost semiconductor layer of the at least two semiconductor layers.

At least one of the above and other features and advantages of the present invention may be realized by providing a method of forming a stacked memory. The method includes forming a first memory cell array at a first semiconductor layer. A second semiconductor layer is formed on the first semiconductor layer having the first memory cell array. A second memory cell array is formed in a cell array region of the second semiconductor layer. A first transistor is formed in a peripheral circuit region of the second semiconductor layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that although terms such as "first," "second," and "third" are used herein to describe various regions, layers, and/or sections, these regions, layers and/or sections are not limited by these terms, which are only used to distinguish one region, layer and/or section from another region, layer and/or section. In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terms "semiconductor layer" and "substrate" are used herein to include any semiconductor-based structure. The semiconductor-based structure may include, e.g., a single-crystalline silicon structure, a silicon-on-insulator (SOI) structure, a silicon-on-sapphire (SOS) structure, a silicon-germanium structure, a doped or non-doped silicon structure, an epitaxially grown structure, etc.

Exemplary embodiments of the present invention are related to a stacked memory. A stacked memory according to an exemplary embodiment of the present invention may include at least two semiconductor layers, and each semiconductor layer may include a memory cell array. For convenience of explanation, the semiconductor layers may be referred to as "upper" and "lower" layers.

A transistor for driving the memory cell array may be provided in a peripheral circuit region of an uppermost semiconductor layer. Hereinafter, such a transistor formed in the peripheral circuit region may be referred to as a "peripheral" transistor. Multiple peripheral transistors may be provided, which may include various transistors that are used to operate the memory cell array. For example, peripheral transistors may include a high-voltage transistor and a low-voltage transistor. The high-voltage transistor may be a transistor that applies a high voltage to the memory cell array, e.g., for programming and/or erasing a memory cell of the memory cell array. The low-voltage transistor may be a transistor that applies a lower voltage, i.e., lower relative to the high voltage transistor. For example, the low-voltage transistor may be a transistor that applies Vdd or Vcc to the memory cell, or various voltages required for reading data from the memory cell. The peripheral transistors may also include a middle-voltage transistor. In the description that follows, unless noted otherwise, the low-voltage transistor, middle-voltage transistor, and high-voltage transistor may each be a peripheral transistor.

The memory cell arrays of the semiconductor layers may be individually formed in various ways. For example, a NAND flash memory cell array having NAND strings may be formed on the first semiconductor layer or on the second semiconductor layer, and a NOR flash memory cell array may be formed at the second semiconductor layer or the first semiconductor layer. In another implementation, an SRAM cell array may be formed at the first semiconductor layer or the second semiconductor layer, and a flash memory cell array may be formed at the second semiconductor layer or the first semiconductor layer.

The memory cells of the memory cell arrays may be, e.g., floating gate type memory cells. However, the present invention is not limited thereto, and other types of memory cells may be suitably employed. For example, silicon-oxide-nitride-oxide-silicon (SONOS) memory cells, metal-oxide-nitride-oxide-silicon (MONOS) memory cells, phase-changeable random access memory (PRAM) cells, and magneto-resistive random access memory (MRAM) cells may be employed. Moreover, each memory cell may store one or more bits of data.

In an embodiment, a peripheral transistor may be provided on an uppermost semiconductor layer of the at least two semiconductor layers of a stacked memory. Here, the uppermost semiconductor layer may be the uppermost of stacked semiconductor layers on which memory cell arrays are respectively formed, or the uppermost one of at least two stacked semiconductor layers. The peripheral transistor may be formed without the thermal budget associated with processes such as high-temperature deposition, oxidation, heat treatment for activating impurities, and rapid heat treatment. Therefore, according to embodiments of the present invention, a stacked memory having a high-performance peripheral transistor may be formed.

In addition, the depth of contact holes for interconnection to the peripheral transistors may be reduced, and the size of contact holes may be significantly reduced in a peripheral circuit region. Therefore, embodiments of the present invention may provide a stacked memory that can be more highly integrated. Furthermore, semiconductor layers of the stacked memory, other than the uppermost semiconductor layer, may not include a peripheral transistor, such that areas can be freed up in the lower semiconductor layers. The freed-up areas may thus be used for various other applications, e.g., additional memory cells may be provided therein.

In another embodiment, some peripheral transistors may be formed on a lowermost semiconductor layer of the stacked memory, or on a semiconductor layer interposed between the uppermost and lowermost semiconductor layers. For example, a heat-sensitive transistor, such as a low-voltage transistor, may be formed on the uppermost semiconductor layer, which may allow the heat-sensitive transistor to be formed without exposure to high-temperature conditions during processes for cell array regions of the semiconductor layers. A heat-tolerant transistor, such as a high-voltage transistor, may be formed on a semiconductor layer that is disposed in the stack under the uppermost semiconductor layer. In an implementation, a high-voltage peripheral transistor may be formed on the lowermost semiconductor layer, or on a semiconductor layer interposed between the uppermost and lowermost semiconductor layers, and a low-voltage transistor may be formed on the uppermost semiconductor layer of the stack. Each memory cell array of the stacked semiconductor layers may include two-dimensionally arranged memory cells.

In the description that follows, particular reference may be made to exemplary embodiments of the present invention wherein NAND flash memory cells are connected in series and a floating gate is used as a memory element. These particular examples are provided simply to present a clear and thorough description of the present invention, but embodiments of the present invention are not limited thereto, and various types and structures of memory cells may be arranged in the memory cell array in various ways, and various programming/erasing operations may be used for the memory cells.

Figure 1:
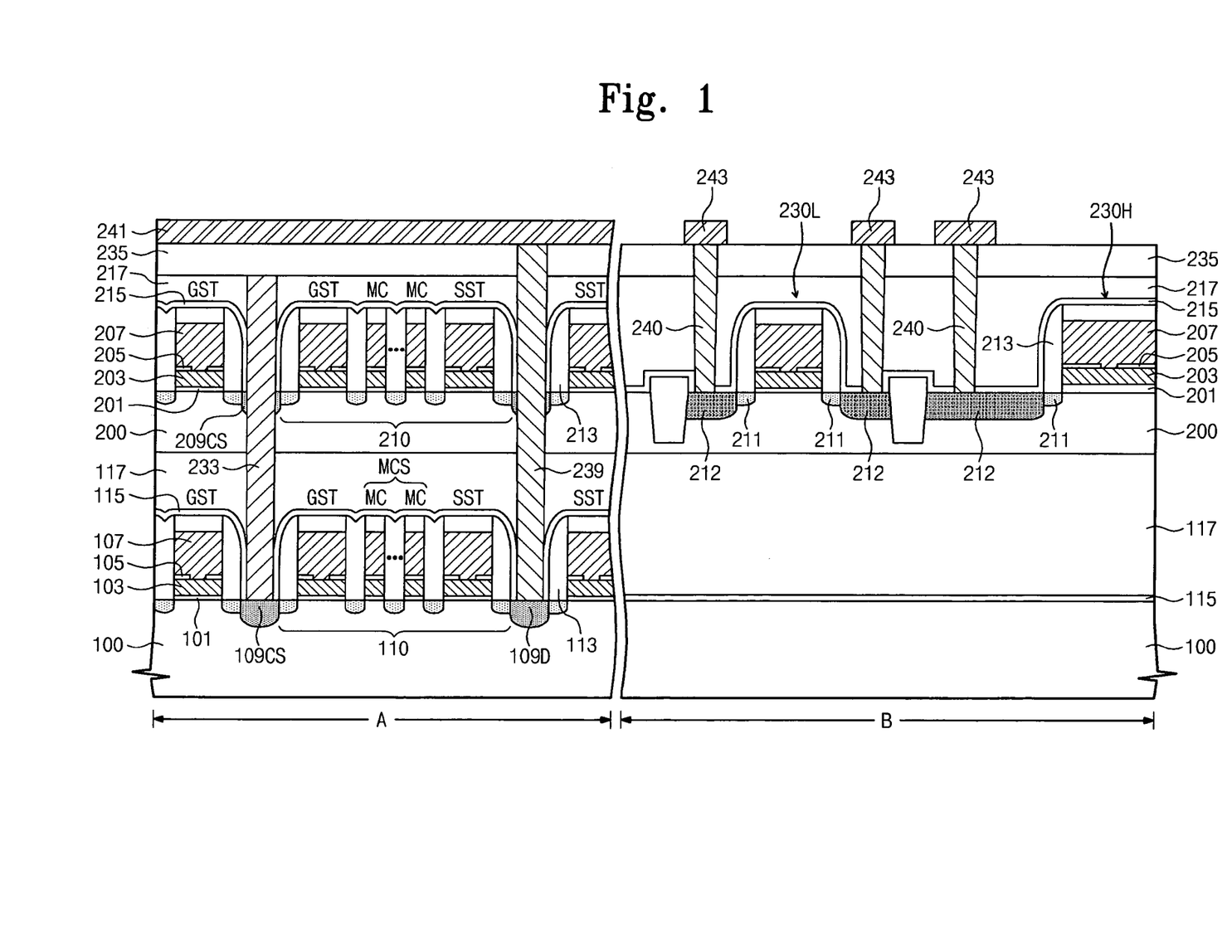
FIG. 1 illustrates a schematic diagram of a stacked memory device according to an embodiment of the present invention.

FIG. 1 illustrates a schematic diagram of a stacked memory device according to an embodiment of the present invention. In the stacked memory device illustrated in FIG. 1, the stacked memory device may include two or more semiconductor layers. However, for clarity, only a first semiconductor layer 100 and a second semiconductor layer 200 are shown.

Referring to FIG. 1, the second semiconductor layer 200 may be stacked on the first semiconductor layer 100. The second semiconductor layer 200 may correspond to the uppermost semiconductor layer and the first semiconductor layer 100 may correspond to the lowermost semiconductor layer.

Memory cell arrays may be formed in cell array regions A of the first semiconductor layer 100 and the second semiconductor layer 200. The memory cell array of the first semiconductor layer 100 may include one or more NAND strings 110 and the memory cell array of the second semiconductor layer 200 may include one or more NAND strings 210. One or more peripheral transistors may be formed in a peripheral circuit region B of the second semiconductor layer (uppermost semiconductor layer) 200. The peripheral transistors may drive the memory cell arrays. The peripheral transistors may include a high-voltage transistor 230H and a low-voltage transistor 230L. In an implementation, the first semiconductor layer (lowermost semiconductor layer) 100 may not include a peripheral transistor.

The memory cell arrays of the semiconductor layers may each have a same structure. An exemplary memory cell array of the first semiconductor layer 100 will now be described. The NAND string 110 may include a memory cell string (hereinafter, "MCS"), a string selection transistor (hereinafter, "SST"), and a ground selection transistor (hereinafter, "GST"). The MCS may include a plurality of memory cells (hereinafter, individually "MC" and collectively "MCs") connected in series. The SST may be connected to a first MC of the MCS, and the GST may be connected to a last MC of the MCS.

Multiple NAND strings 110 may be disposed on the first semiconductor layer 100, thereby forming a memory cell array. In an implementation, the NAND strings 110 may be repeatedly formed in a mirror-symmetric format, so as to increase the integration density of the stacked memory device. For example, the NAND strings 110 may be repeatedly formed such that GSTs of neighboring NAND strings 110 are disposed close to each other and SSTs of the neighboring NAND strings 110 are also disposed close to each other.

Each of the MCs, GST, and SST may include a stacked gate structure having, sequentially stacked on the first semiconductor layer 100, a gate insulation layer 101, a floating gate 103, an inter-gate insulation layer 105, and a control gate 107. The peripheral transistor may include a similar stacked gate structure on the second semiconductor layer 200. The control gates of the peripheral transistor, the SST, and the GST may be electrically connected to the floating gates through the inter-gate insulation layers.

The control gates of the MCs that are arranged in a direction perpendicular to cross-section illustrated in FIG. 1, i.e., in and out of the plane of FIG. 1, may be electrically connected to one another to serve as a word line (hereinafter, "WL"). For reference, the direction of MCs of the NAND string 110 illustrated in FIG. 1 will be referred to as the x-axis direction and the direction perpendicular to cross-section illustrated in FIG. 1, i.e., out of plane, will be referred to the y-axis direction. Like the control gates of the MCs forming the WL, the control gates of the SSTs arranged in the y-axis direction may be electrically connected to one another to serve as a string selection line (hereinafter "SSL"), and the control gates of the GSTs arranged in the y-axis direction may be electrically connected to one another to serve as a ground selection line (hereinafter "GSL").

Each MC of the NAND string 110 may include a memory cell gate and impurity diffusion regions formed on opposite sides of the memory cell gate. In a given NAND string 110, neighboring memory cell gates may share impurity diffusion regions. As illustrated in the cell array region A of the first semiconductor layer 100, a common source region CS may be shared by neighboring NAND strings, i.e., an impurity diffusion region 109CS between the GSTs of neighboring NAND strings 110 may be common to the NAND strings 110. That is, in a same semiconductor layer, the impurity diffusion region formed between the neighboring GSTs may be shared as a common source region 109CS.

The common source region 109CS may extend in the y-axis direction, i.e., it may be a linear type. Further, common source regions 109CS and 209CS of the stacked semiconductor layers 100 and 200, respectively, may be electrically connected by a linear type source contact 233. The linear type source contact 233 may function as a common source line (hereinafter, "CSL") that connects a common source region 109CS of the first semiconductor layer 100 to a common source region 209CS of the second semiconductor layer 200. The common source regions 109CS and 209CS may be considered as a CSL in light of the linear configuration of the common source regions 109CS and 209CS, with the source contact 233 connecting the CSL in the lower semiconductor layer to an adjacent CSL in the upper semiconductor layer. Neighboring GSTs of a given semiconductor layer may share a common source region given the mirror-symmetric arrangement of the NAND strings 110. Moreover, neighboring GSTs of another semiconductor layer may share the common source region owing to the source contact 233.

An impurity diffusion region (drain region) 109D formed at a side of a given NAND string 110, opposite to the common source region 109CS, may be electrically connected to a bit line 241 through a bit line contact plug 239. Drain regions of SSTs arranged in the y-axis direction may be electrically connected to different bit lines, and drain regions of SSTs arranged in the x-axis direction may be electrically connected to a same bit line. Further, drain regions of SSTs arranged above/below one another may be electrically connected through, for example, a bit line contact plug. In the peripheral circuit region B, impurity diffusion regions 212 of the low-voltage transistor 230L and the high-voltage transistor 230H may be electrically connected to interconnections 243 by interconnection plugs 240.

Gate spacers 113 and 213 may be disposed on opposite sides of the gate structures, and etch stop layers 115 and 215 may cover the gate structures and the gate spacers. The memory device may further include interlayer insulation layers 117, 217, and 235, and contact plugs (line plugs) 239 and 240.

Figure 2:
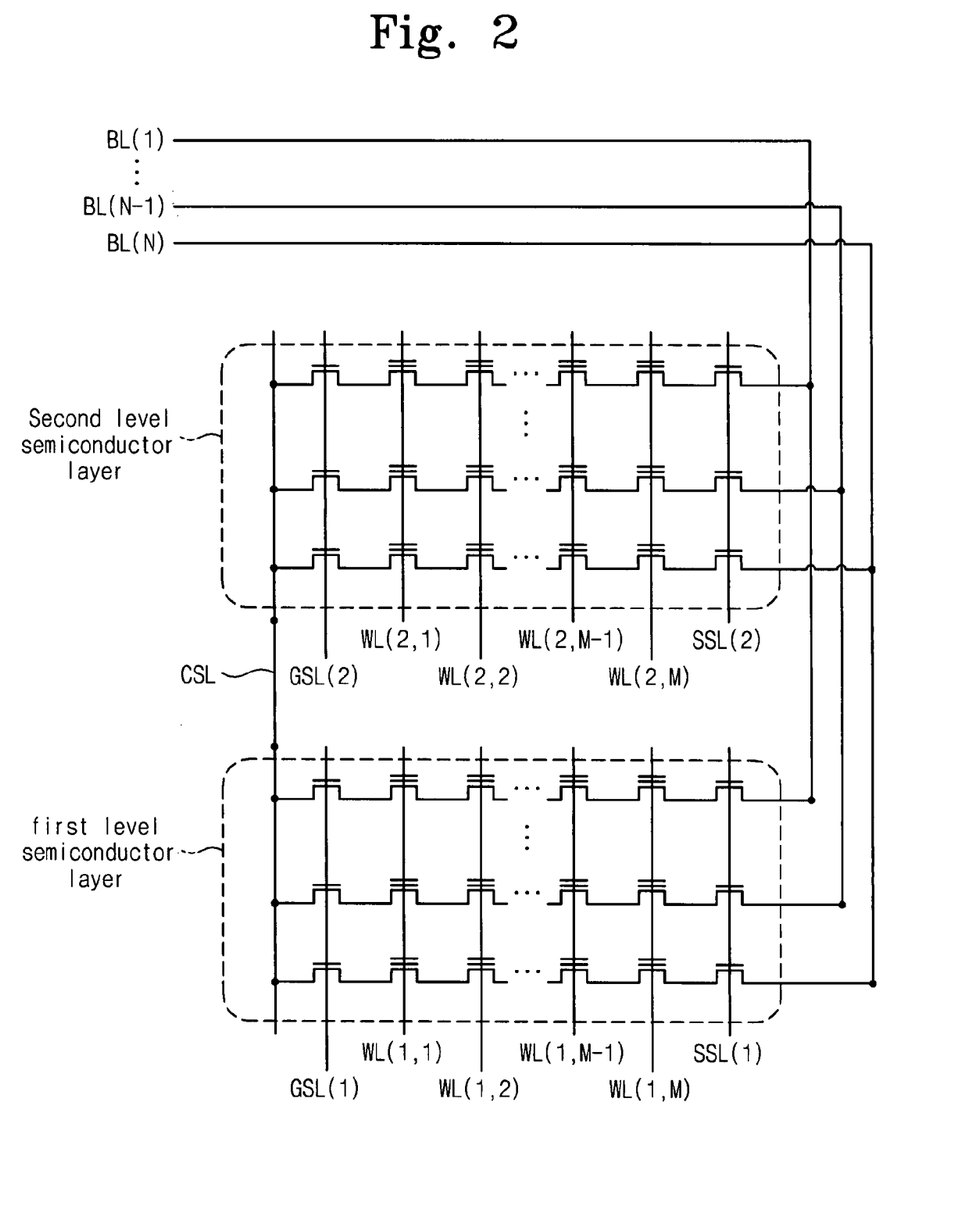
FIG. 2 illustrates an equivalent circuit diagram of the stacked memory device of FIG. 1.

FIG. 2 illustrates an equivalent circuit diagram of the stacked memory device of FIG. 1. Referring to FIG. 2, WL(1, 1) denotes a first word line of the NAND strings 110 of the first semiconductor layer 100 and WL(2, 1) denotes a first word line of the NAND strings 210 of the second semiconductor layer 200. SSL(1) denotes the SSL of the first semiconductor layer 100 and SSL(2) denotes the SSL of the second semiconductor layer 200. Similarly, GSL(1) denotes the GSL of the first semiconductor layer 100 and GSL(2) denotes the GSL of the second semiconductor layer 200. CSL denotes the common source line, e.g., the source contact 233, connecting the respective common source regions 109CS and 209CS of the first and second semiconductor layers 100 and 200.

Figure 3:
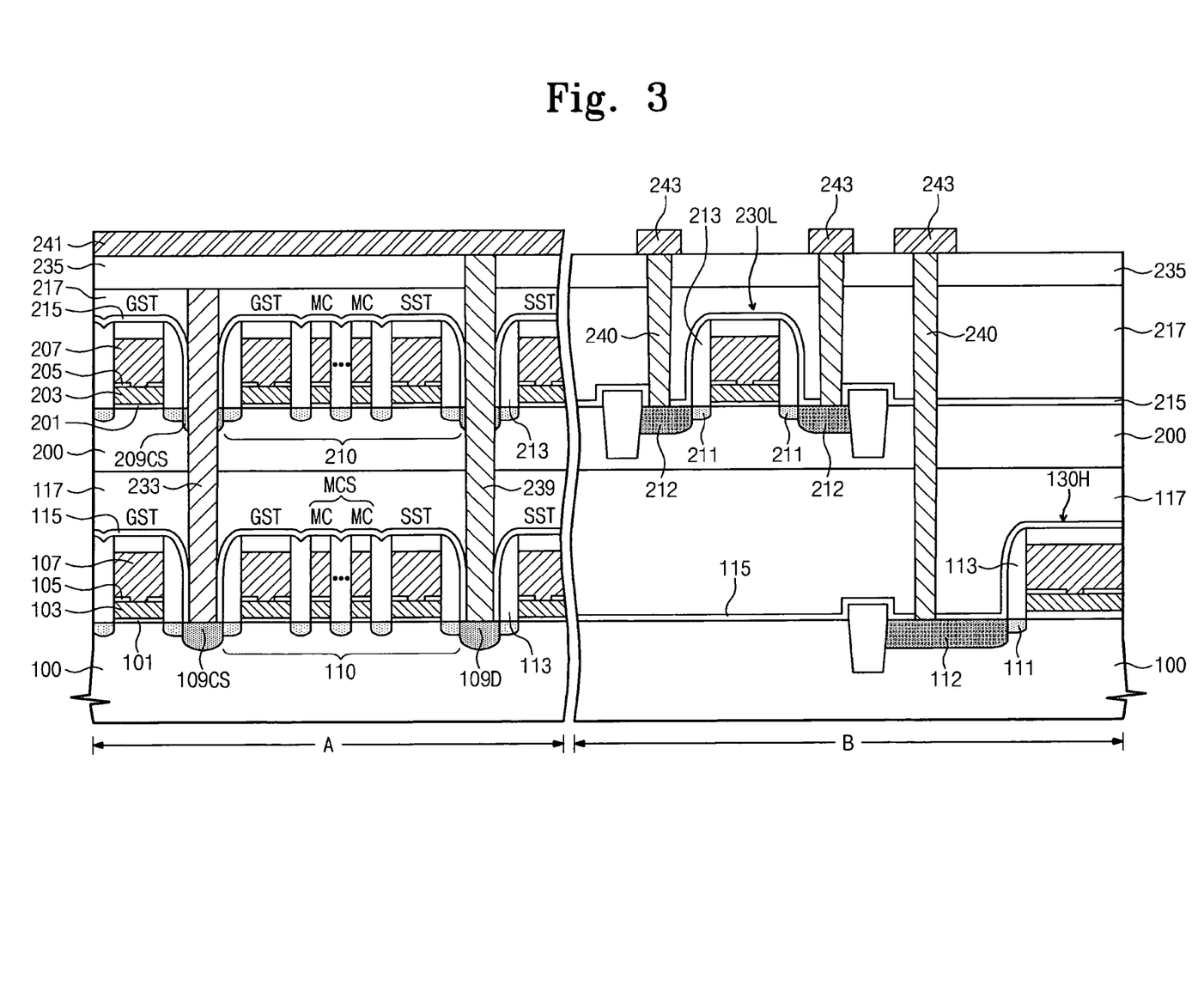
FIG. 3 illustrates a schematic diagram of a stacked memory device according to another embodiment of the present invention.

FIG. 3 illustrates a schematic diagram of a stacked memory device according to another embodiment of the present invention, in which one or more peripheral transistors may be disposed on a semiconductor layer, e.g., the first semiconductor layer 100, under the uppermost semiconductor layer, which may be the second semiconductor layer 200. Referring to FIG. 3, in an implementation, a high-voltage transistor 130H may be disposed on the first semiconductor layer 100, and a low-voltage transistor 230L may be disposed on the second semiconductor layer 200.

In another implementation (not shown) the stacked memory device may include L semiconductor layers, where L is a natural number greater than or equal to 3, and the high-voltage transistor 130H may be disposed on the lowermost semiconductor layer, or on a semiconductor layer between the uppermost and lowermost semiconductor layers. The high-voltage transistor 130H may be less affected by high-temperature process conditions than the low-voltage transistor 230L, and, thus, the high-voltage transistor 130H may be disposed on the lowermost semiconductor layer or a semiconductor layer formed between the uppermost and lowermost semiconductor layers.

Figure 4:
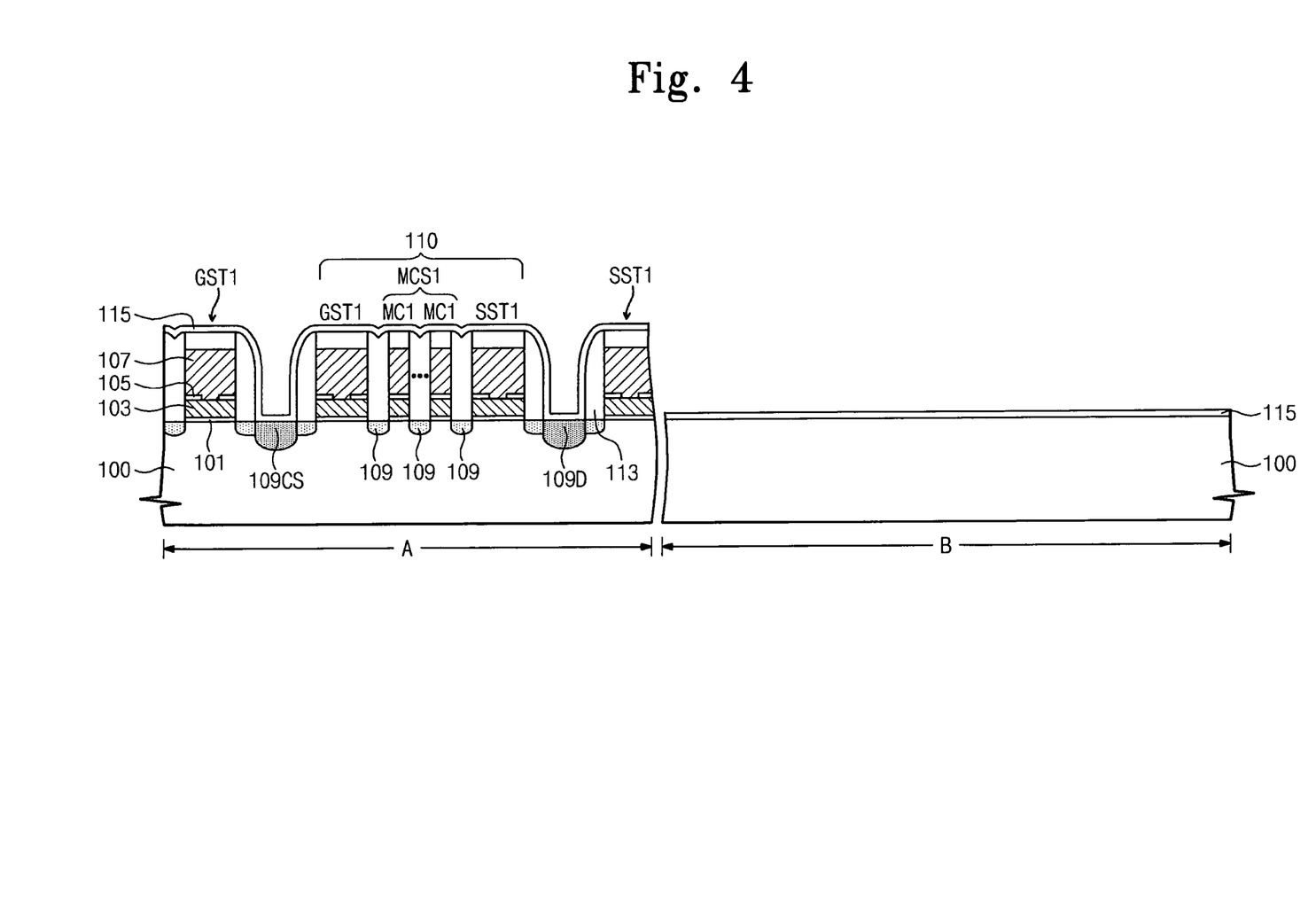
FIGS. 4 through 8 illustrate cross-sectional views of stages in a method of forming the stacked memory device shown in FIG. 1 according to an embodiment of the present invention.

Hereinafter, a method of forming a stacked memory device will be described according to embodiments of the present invention. FIGS. 4 through 8 illustrate cross-sectional views of stages in a method of forming the stacked memory device shown in FIG. 1 according to an embodiment of the present invention. Referring to FIG. 4, first NAND string 110 may be formed in a cell array region A of a first semiconductor layer 100. The first NAND string 110 may include a first memory cell string (hereinafter, "MCS1") having a plurality of first memory cells (hereinafter, individually "MC1" and collectively "MC1s") connected to one another in series, and a first string selection transistor (hereinafter, "SST1") and a first ground selection transistor (hereinafter, "GST1") that are respectively connected to MC1s at ends of the MCS1.

Each of the MC1s, SST1, and GST1 may include a stacked gate structure formed by sequentially stacking a gate insulation layer 101, a floating gate 103, an inter-gate insulation layer 105, and a control gate 107. In the SST1 and the GST1, the control gate may be electrically connected to the floating gate. The control gate 107 of the SST1 and the GST1 may be elongated in the y-axis direction, i.e., in and out of the plane of FIG. 4 and may serve as a SSL and a GSL, respectively. The control gates 107 of the MC1s may function as word lines.

The gate structure may be formed by sequentially stacking the gate insulation layer 101, a first conductive layer for the floating gates 103, the inter-gate insulation layer 105, and a second conductive layer for the control gates 107 on the first semiconductor layer 100 and patterning the stacked layers. After the inter-gate insulation layer 105 is stacked, the inter-gate insulation layer 105 may be patterned to expose the lower first conductive layer, to allow for electrical connections between the floating gate 103 and the control gate 107 of the GST1, and the floating gate 103 and the control gate 107 of the SST1. That is, in the GST1 and SST1, the control gate 107 may be electrically connected to the floating gate 103 through the inter-gate insulating layer 105.

In an implementation, the gate insulation layer 101 may be formed of, e.g., a silicon oxide. The first conductive layer for the floating gates 103 may be formed of, e.g., polysilicon. The inter-gate insulation layer 105 may be formed by, e.g., sequentially stacking an oxide layer, a nitride layer, and an oxide layer. The second conductive layer, which may be used for forming the control gates 107, i.e., word lines, of the MC1s and the control gates 107 (GSL and SSL) of the GST1 and SST1, may be formed of, e.g., polysilicon, metal, metal silicide, conductive metal nitride, a combination thereof, etc. The control gates 107 may be covered with a protective nitride layer.

After the gate structure of the first NAND string 110 is formed, impurity diffusion regions 109 may be formed in the first semiconductor layer 100 between the gate structures for source/drain regions using, e.g., ion implantation and heat treatment processes. An impurity diffusion region 109 of neighboring GST1s may be shared as a common source region 109CS. That is, the common source region 109CS may be formed between gate structures, i.e., between GSLs, of neighboring GST1s. Similarly, neighboring SST1s may share a drain region 109D, as illustrated in FIG. 4.

Gate spacers 113 may be formed on opposite sides of the gate structures. The gate spacers 113 may be formed by, e.g., depositing a silicon nitride layer and etching the silicon nitride layer. Since the distance between the MC1s may be very short, gate spacers 113 of neighboring memory cells may contact each other. After the gate spacers 113 are formed, a high-concentration impurity ion implantation process may be performed to improve resistive characteristics of the drain region 109D of the SST1 and the common source region 109CS of the GST1.

A first etch stop layer 115 may be formed as shown in FIG. 4. The first etch stop layer 115 may be formed of, e.g., a silicon nitride layer. The first etch stop layer 115 may function as an etch stop layer during a process of forming contacts. In another implementation (not shown), the first etch stop layer may be omitted.

Figure 5:
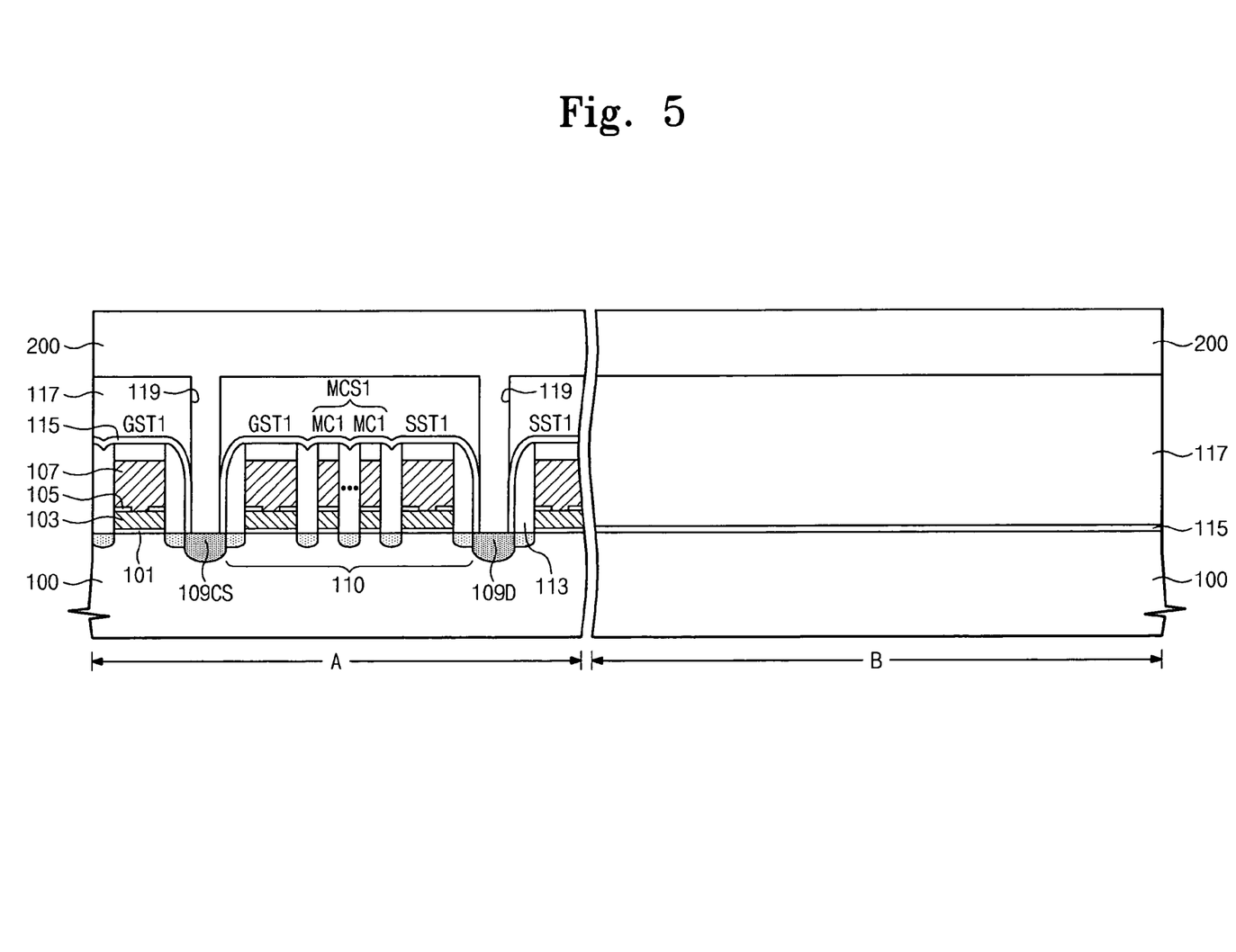

Referring to FIG. 5, a first interlayer insulation layer 117 may be formed on the first etch stop layer 115. The first interlayer insulation layer 117 may be formed of, e.g., an insulation material having an etch selectivity with respect to the first etch stop layer 115. The first interlayer insulation layer 117 may be, e.g., a silicon oxide. The first interlayer insulation layer 117 and the first etch stop layer 115 may be patterned to form openings 119 that expose a portion of the first semiconductor layer 100 located beside the gate structure of the GST1 and another portion of the first semiconductor layer 100 located beside the gate structure of the SST1. That is, the common source region 109CS beside the GST1 and the drain region 109D beside the SST1 may be exposed by the openings 119. An epitaxial layer may be grown using the first semiconductor layer 100 exposed by the openings 119 as a seed layer, so as to form a second semiconductor layer 200 filling the openings 119 and covering the first interlayer insulation layer 117.

Figure 6:
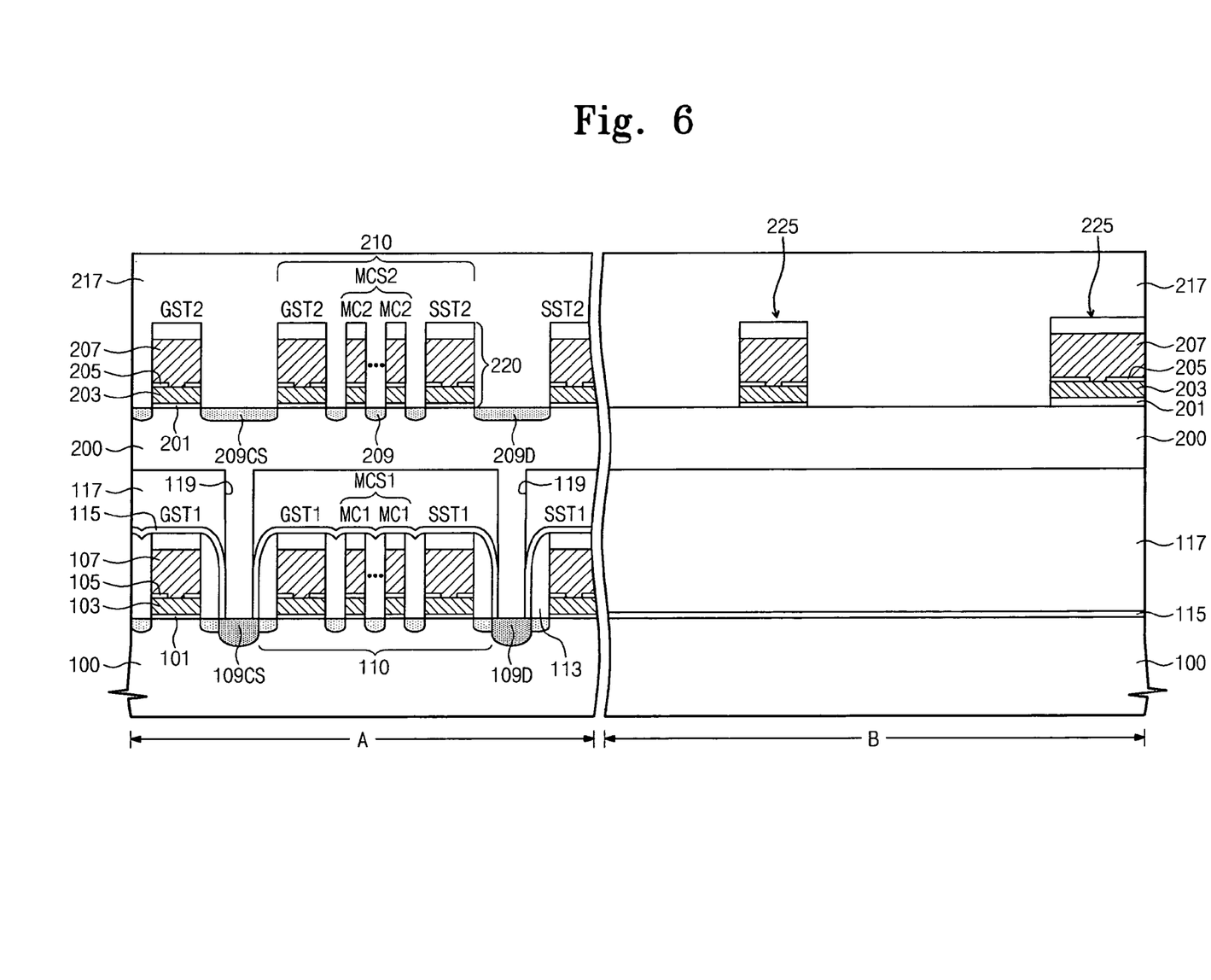

Referring to FIG. 6, second NAND string 210 may be formed in a cell array region A of the second semiconductor layer 200, and a peripheral gate structure 225 may be formed in a peripheral circuit region B of the second semiconductor layer 200 to form a peripheral transistor. Second NAND strings 210 may be formed with the same structure and using the same method as the first NAND strings 110.

In detail, a gate structure 220 may be formed in the cell array region A of the second semiconductor layer so as to form second memory cells (hereinafter, "MC2s"), second string selection transistors (hereinafter, "SST2s"), and second ground selection transistors (hereinafter, "GST2s") of the second NAND strings 210. The peripheral gate structure 225 in the peripheral circuit region B of the second semiconductor layer 200 may be similarly formed. The gate structures in the cell array region A and the peripheral circuit region B of the second semiconductor layer 200 may be formed by sequentially stacking a gate insulation layer 201, a first conductive layer, an inter-gate insulation layer 205, and a second conductive layer on the second semiconductor layer 200 and patterning the stacked layers.

After the inter-gate insulation layer 205 is stacked, the inter-gate insulation layer 205 may be patterned to expose the lower first conductive layer to allow for electrical connection between the floating gate 203 and the corresponding control gate 207 in the GST2, the SST2, and the peripheral transistors.

Impurity ions may be selectively implanted in the cell array region A of the second semiconductor layer 200 and the cell array region A may be heat treated to form impurity diffusion regions 209 between the gate structures in the cell array region A as source/drain regions. An impurity diffusion region 209 between neighboring GST2s may be shared as a common source region 209CS. That is, the common source region 209CS may be formed between gate structures of neighboring GST2s. Similarly, neighboring SST2s may share a drain region 209D.

Figure 7:
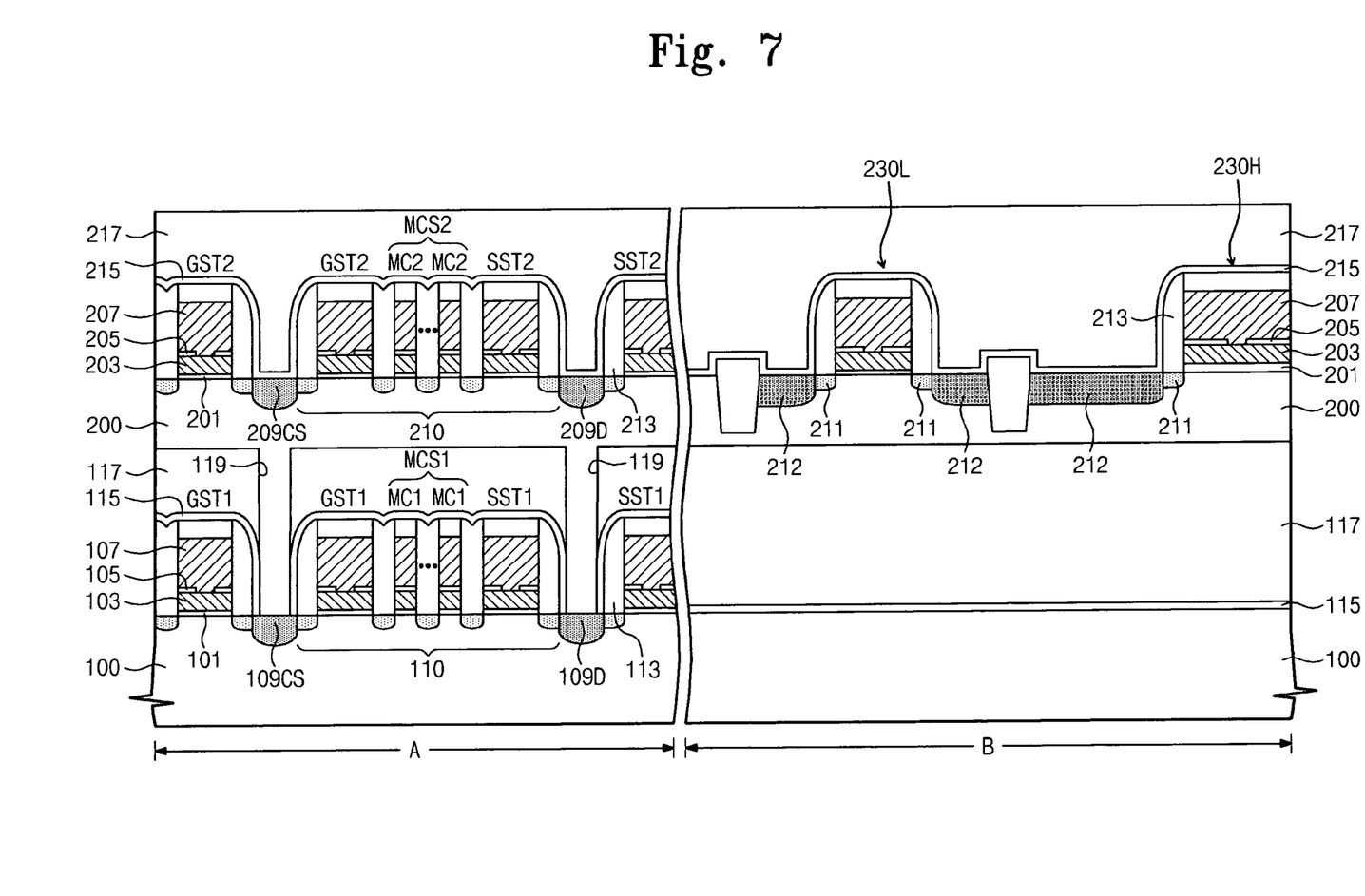

Referring to FIG. 7, after the impurity diffusion regions 209 are formed in the cell array region A of the second semiconductor layer 200, impurity ions may be selectively implanted in the peripheral circuit region B of the second semiconductor layer 200, and the peripheral circuit region B may be heat treated to form impurity diffusion regions 211 for peripheral transistors 230L and 230H. According to this embodiment of the present invention, the peripheral transistors 230L and 230H need not undergo the ion implantation and heat treatment processes performed for forming the impurity regions 209 in the cell array region A.

Gate spacers 213 may be formed on opposite sides of the gate structures of the second semiconductor layer 200. Ions may be implanted to a high concentration level, so as to form high-concentration source/drain regions 212 for the peripheral transistors 230L and 230H. At this time, ions may also be implanted to a high-concentration level into the drain region 209D of the SST2 and the source region (common source region) 209CS of the GST2, so as to improve the resistive characteristics of the drain region 209D and the source region 209CS.

A second etch stop layer 215 and a second interlayer insulation layer 217 may be formed, and may include materials having predetermined etch rates. For example, the second etch stop layer 215 may be formed of a silicon nitride and the second interlayer insulation layer 217 may be formed of a silicon oxide.

Figure 8:
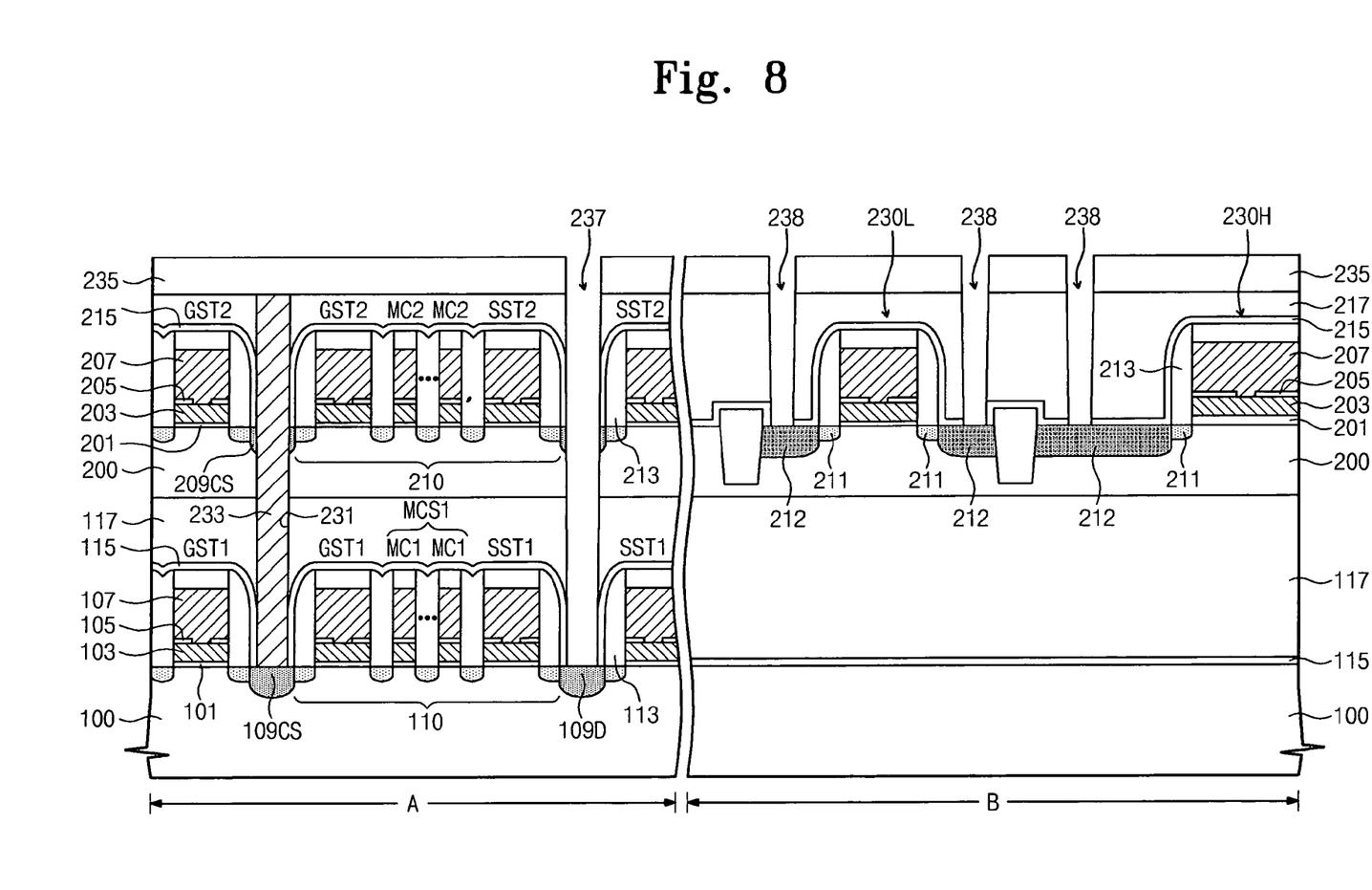

Referring to FIG. 8, the second interlayer insulation layer 217, the second etch stop layer 215, the second semiconductor layer 200, the first interlayer insulation layer 117, and the first etch stop layer 115 may be patterned to form an opening 231 for a source contact in the cell array region A. The opening 231 may expose the common source regions 109CS and 209CS formed between gate structures of the GST1s and GST2s of the first and second semiconductor layers 100 and 200.

The opening 231 may be filled with a conductive material to form a source contact 233 that electrically connects the common source regions 109CS and 209CS of the first and second semiconductor layers 100 and 200. The source contact 233 may be used as a CSL for the first and second semiconductor layers 100 and 200. In an implementation, impurity ions may be implanted into the common source regions 109CS and 209CS through the opening 231 to improve the resistive characteristics of the common source regions 109CS and 209CS.

A third interlayer insulation layer 235 may be formed on the second interlayer insulation layer 217 and on the source contact 233. The third interlayer insulation layer 235, the second interlayer insulation layer 217, the second etch stop layer 215, the second semiconductor layer 200, the first interlayer insulation layer 117, and the first etch stop layer 115 may be patterned to form a bit line contact hole 237 in the cell array region A that exposes the drain regions 109D and 209D between gate structures of the SST1s and SST2s of the first and second semiconductor layers 100 and 200. At the same time, in the peripheral circuit region B of the second semiconductor layer 200, an interconnection contact hole 238 may be formed through the third interlayer insulation layer 235, the second interlayer insulation layer 217, and the second etch stop layer 215 to expose the drain region 212. In an implementation, impurity ions may be implanted into the drain regions 109D and 209D through the bit line contact hole 237 to improve the resistive characteristics of the drain regions 109D and 209D.

A conductive material may be formed on the third interlayer insulation layer 235 to fill the bit line contact hole 237 and the contact hole 238 for interconnections (not shown). Then, referring again to FIG. 1, the conductive material may be patterned to form a bit line 241 in the cell array region A and a metal line 243 in the peripheral circuit region B.

The plurality of semiconductor layers may be stacked using various methods including, e.g., forming an upper semiconductor layer by epitaxial growth using a lower semiconductor as a seed layer, as described above. In another implementation, a plurality of semiconductor layers may be stacked by depositing amorphous silicon and heat-treating the deposited amorphous silicon. In this case, referring to FIGS. 4 and 5, after forming the NAND strings 110 in the cell array region A of the first semiconductor layer 100, and forming the first etch stop layer 115 and the first interlayer insulation layer 117 on the first semiconductor layer 100, amorphous silicon may be deposited on the first interlayer insulation layer 117 and heat treated so as to form a second semiconductor layer. The remaining processes illustrated in FIGS. 6 through 8 may then be performed as described above.

In another implementation, a plurality of semiconductor layers may be stacked by bonding separately-prepared semiconductor layers. In this case, referring again to FIGS. 4 and 5, after forming the NAND strings 110 in the cell array region A of the first semiconductor layer 100, and after forming the first etch stop layer 115 and the first interlayer insulation layer 117 on the first semiconductor layer 100, a separately prepared second semiconductor layer may be bonded to the first interlayer insulation layer 117. The remaining processes illustrated in FIGS. 6 through 8 may then be performed as described above.

FIGS. 9 through 12 illustrate cross-sectional views of stages in a method of forming the stacked memory device illustrated in FIG. 3 according to an embodiment of the present invention. A peripheral transistor, e.g., a high-voltage transistor, may be formed on the lowermost semiconductor layer or a semiconductor layer between the uppermost and lowermost semiconductor layers, instead of forming the high-voltage transistor on the uppermost semiconductor layer.

Figure 9:
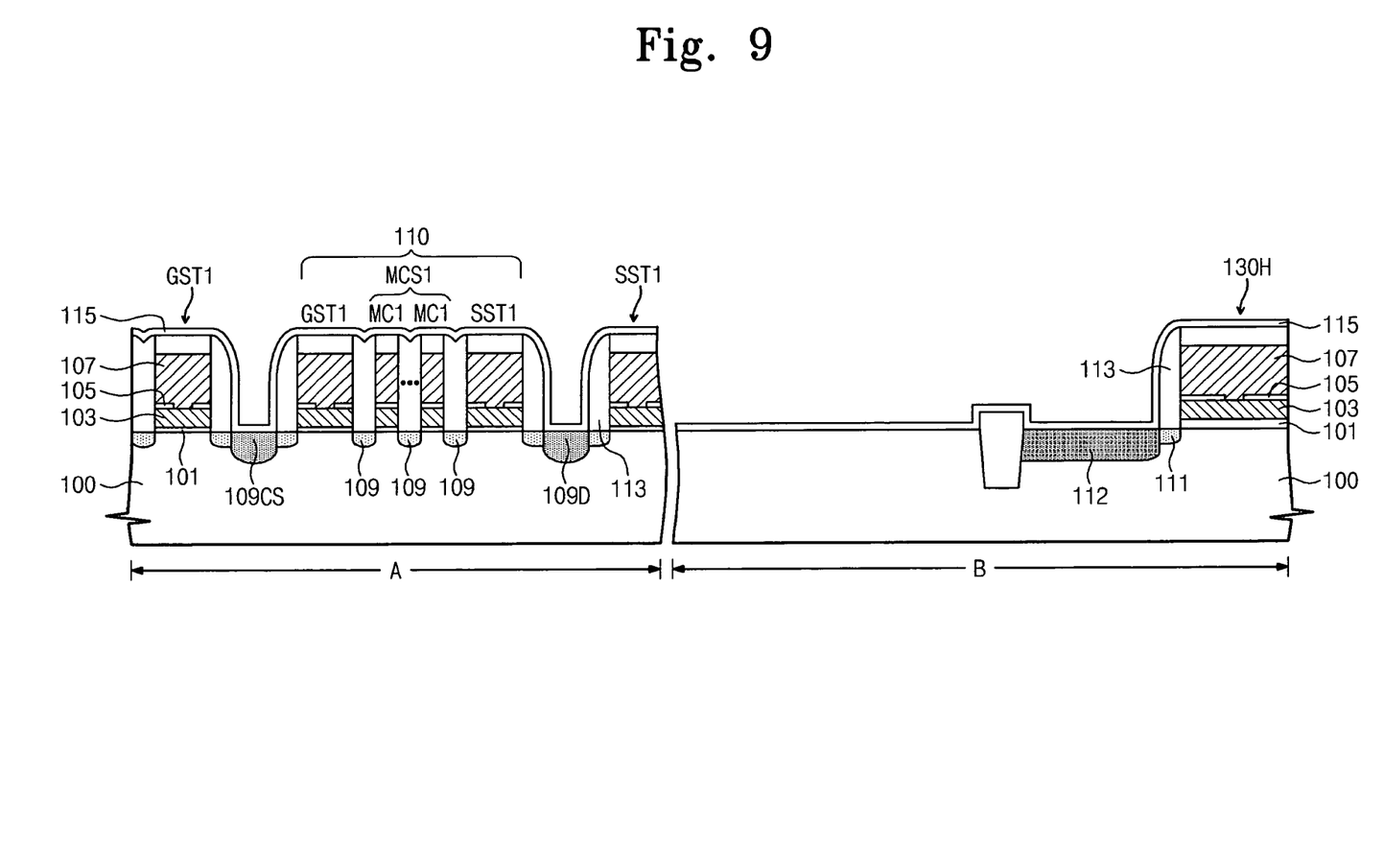
FIGS. 9 through 12 illustrate cross-sectional views of stages in a method of forming the stacked memory device shown in FIG. 3 according to an embodiment of the present invention.

Referring to FIG. 9, when a NAND string 110 is formed in the cell array region A of the first semiconductor layer 100, a high-voltage transistor 130H may be formed in the peripheral circuit region B of the first semiconductor layer 100. Gate structures may be formed for MC1s, GST1, SST1, and the high-voltage transistor 130H. Ion implantation and heat-treatment processes may be performed to form impurity diffusion regions between the gate structures as source/drain regions. Gate spacers 113 may be formed on opposite sides of the gate structures, and the first etch stop layer 115 and the first interlayer insulation layer 117 (see FIG. 10) may be formed on the gate structures and the gate spacers 113. As in the previous embodiment, after the gate spacers 113 are formed, ions may be implanted into the impurity diffusion regions of the SST1, the GST1, and the high-voltage transistor 130H to a high concentration level, so as to improve the resistive characteristics of the impurity diffusion regions.

Figure 10:
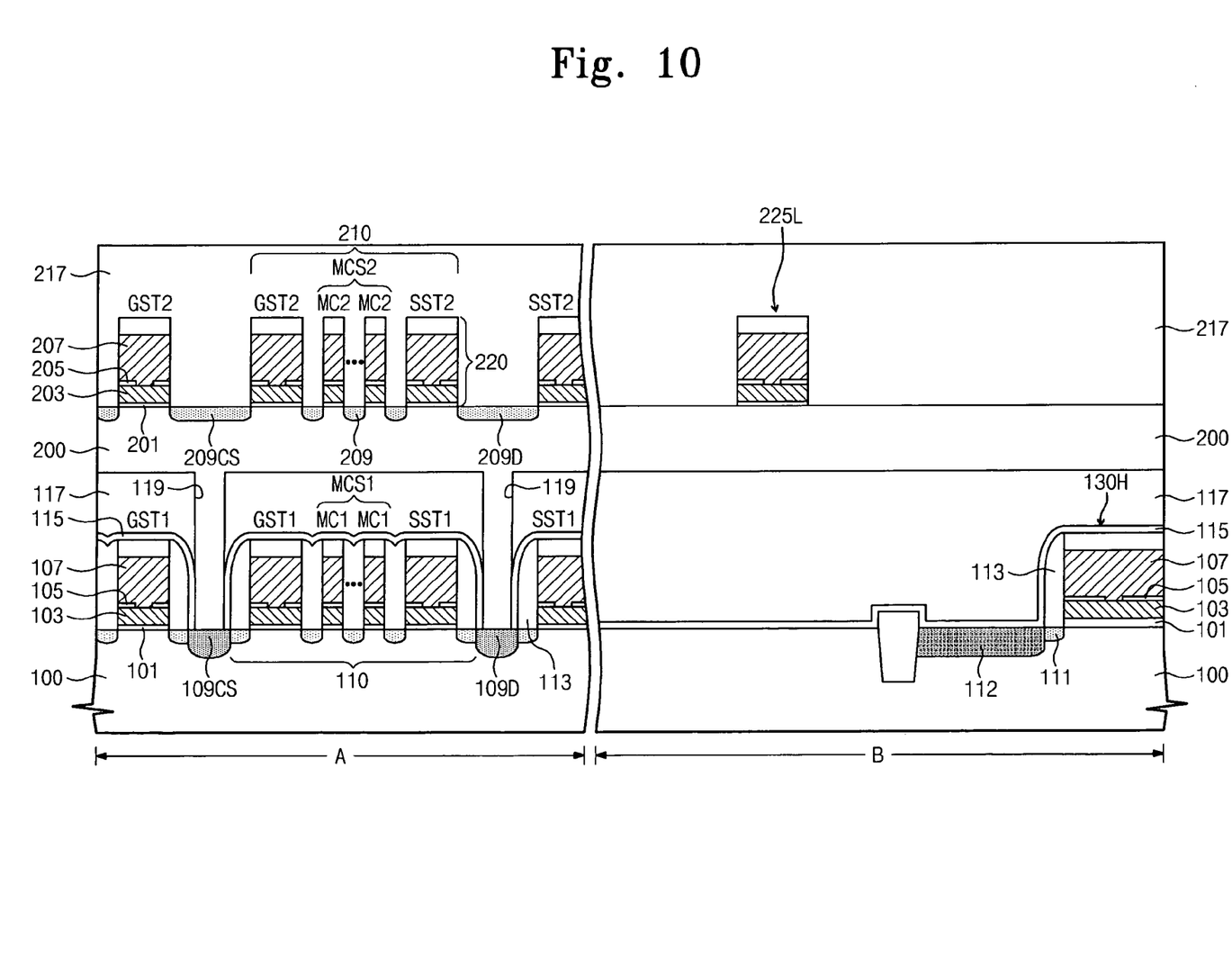

Referring to FIG. 10, similar to the process described above in connection with FIG. 5, the opening 119 may be formed to expose predetermined portions of the first semiconductor layer 100, and then a second semiconductor layer 200 may disposed on the first interlayer insulation layer 117, e.g., using formation by epitaxial growth. In an implementation (not shown) another opening to enable the epitaxial growth of the second semiconductor layer 200 may be formed in the peripheral circuit region B, the opening exposing an impurity region 112 of the high-voltage transistor 130H in the peripheral circuit region B of the second semiconductor layer 100.

Similar to the process described above in connection with FIG. 6, a second NAND string 210 may be formed in the cell array region A of the second semiconductor layer 200, and a low-voltage gate structure 225L may be formed in the peripheral circuit region B of the second semiconductor layer 200.

Figure 11:
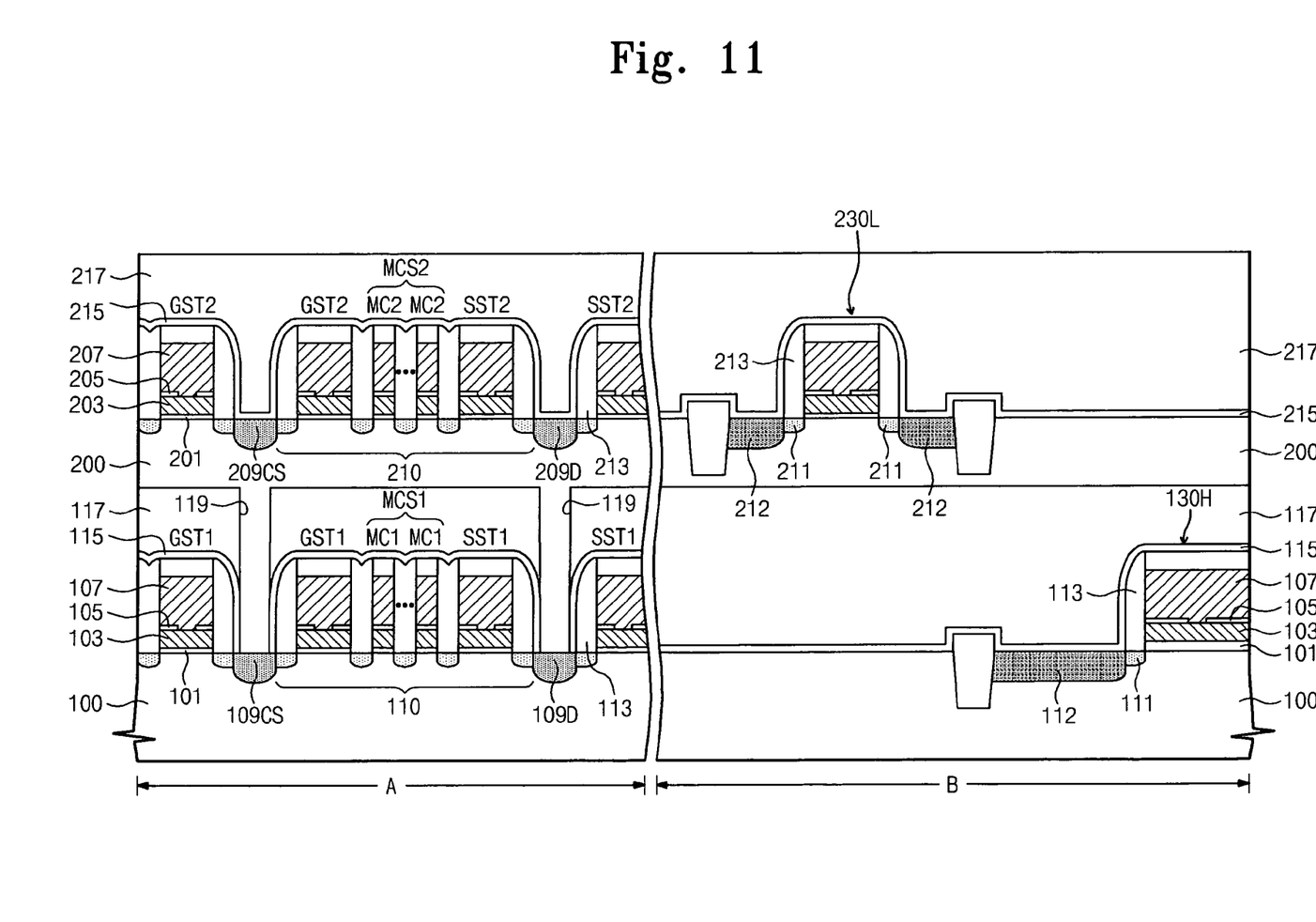

Referring to FIG. 11, impurity diffusion regions 209, 209CS, and 209D may be formed in the cell array region A of the second semiconductor layer 200. Impurity ions may be selectively implanted in the peripheral circuit region B of the second semiconductor layer 200, and the peripheral circuit region B may be heat treated to form impurity diffusion regions 211 for a low-voltage transistor 230L. According to the current embodiment of the present invention, the low-voltage transistor 230L need not undergo the impurity ion implantation and heat treatment processes performed for the impurity diffusion regions of the cell array regions A of the first and second semiconductor layers 100 and 200.

Gate spacers 213 may be formed on opposite sides of the gate structures, and ions may be implanted into the second semiconductor layer 200 to a high-concentration level to form high-concentration impurity regions 212 for the low-voltage transistor 230L. At the same time, ions may be implanted into the impurity diffusion regions (the common source region 209CS and the drain region 209D) of the second semiconductor layer 200 to a high-concentration level. Subsequently, the second etch stop layer 215 and the second interlayer insulation layer 217 may be formed.

Figure 12:
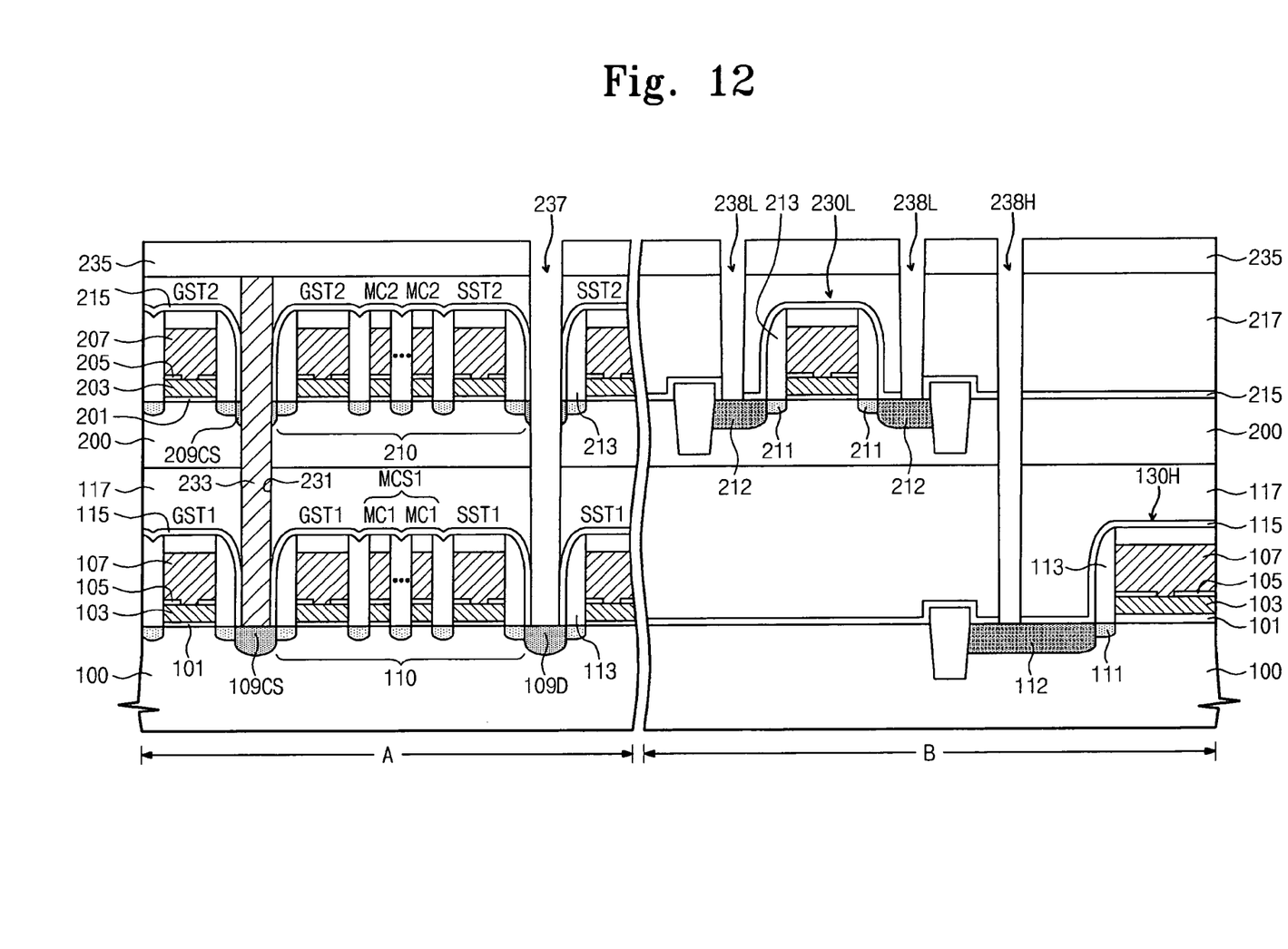

Referring to FIG. 12, the second interlayer insulation layer 217, the second etch stop layer 215, the second semiconductor layer 200, the first interlayer insulation layer 117, and the first etch stop layer 115 may be patterned to form the opening 231 for a source contact that exposes the common source regions 109CS and 209CS between the respective gate structures of the GST1s and GST2s of the first and second semiconductor layers 100 and 200. The opening 231 may be filled with a conductive material to form the source contact 233 that electrically connects the common source regions 109CS and 209CS of the first and second semiconductor layers 100 and 200.

The third interlayer insulation layer 235 may be formed on the second interlayer insulation layer 217 and the source contact 233. The third interlayer insulation layer 235, the second interlayer insulation layer 217, the second etch stop layer 215, the second semiconductor layer 200, the first interlayer insulation layer 117, and the first etch stop layer 115 may be patterned to form the bit line contact hole 237 that exposes drain regions 109D and 209D formed between gate structures of the SST1s and SST2s of the first and second semiconductor layers 100 and 200. At the same time, in the peripheral circuit region B of the second semiconductor layer 200, a first contact hole 238L may be formed through the third interlayer insulation layer 235, the second interlayer insulation layer 217, and the second etch stop layer 215 to expose the impurity region 212 of the low-voltage transistor 230L. Further, in the peripheral circuit regions B of the first and second semiconductor layers 100 and 200, a second contact hole 238H may be formed through the third interlayer insulation layer 235, the second interlayer insulation layer 217, the second etch stop layer 215, the second semiconductor layer 200, the first interlayer insulation layer 117, and the etch stop layer 115 to expose the impurity diffusion region 212 of the high-voltage transistor 230H.

A conductive material may be formed on the third interlayer insulation layer 235 to fill the bit line contact hole 237 and the contact holes 238L and 238H. The contact material may be patterned to form the bit line 241 in the cell array region A and metal lines 243 in the peripheral circuit region B, as illustrated in FIG. 3.

According to an embodiment of the invention, a highly integrated stacked memory device having a reliable peripheral transistor in a peripheral circuit region can be provided.

According to an embodiment of the invention, a stacked memory device can be provided in which the size, e.g., the depth, of contact holes formed in the peripheral circuit region may be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A stacked memory comprising:
   at least two semiconductor layers, each of the at least two semiconductor layers including a memory cell array; and
   a transistor in a peripheral circuit region of an uppermost semiconductor layer of the at least two semiconductor layers.

2. The stacked memory of claim 1, wherein the transistor is configured to drive the memory cell array of each of the at least two semiconductor layers.

3. The stacked memory of claim 1, wherein the transistor comprises a low-voltage transistor.

4. The stacked memory of claim 1, wherein the transistor is configured to read data from a memory cell of the memory cell array of the at least two semiconductor layers.

5. The stacked memory of claim 1, wherein the transistor comprises a low-voltage, and wherein the stacked memory further comprises a high-voltage transistor in a peripheral circuit region of a lowermost semiconductor layer or a semiconductor layer interposed between the uppermost and lowermost semiconductor layers.

6. The stacked memory of claim 5, wherein the high-voltage transistor is configured to program and/or erase a memory cell of the memory cell array of the at least two semiconductor layers.

7. The stacked memory of claim 1, wherein the memory cell array of each of the at least two semiconductor layers comprises:
   a memory cell string of memory cells connected in series;
   a string selection transistor connected to a first end memory cell of the memory cell string; and
   a ground selection transistor connected to a second end memory cell of the memory cell string.

8. The stacked memory of claim 7, further comprising:
   a bit line on the uppermost semiconductor layer and connected to the string selection transistors of the at least two semiconductor layers;
   common source regions alongside the ground selection transistors of the at least two semiconductor layers, respectively; and
   a source contact electrically connecting the common source regions.

9. The stacked memory of claim 7, wherein the transistor comprises a low-voltage transistor, and wherein the stacked memory further comprises a high-voltage transistor in a peripheral circuit region of a lowermost semiconductor layer of the at least semiconductor layers or a semiconductor layer interposed between the uppermost and lowermost semiconductor layers.

10. The stacked memory of claim 9, further comprising:
    a bit line formed on the uppermost semiconductor layer and connected to the string selection transistors of the at least two semiconductor layers;
    common source regions alongside the ground selection transistors of the at least two semiconductor layers, respectively; and
    a source contact electrically connecting the common source regions.

11. A method of forming a stacked memory, comprising:
    forming a first memory cell array at a first semiconductor layer;
    forming a second semiconductor layer on the first semiconductor layer having the first memory cell array;
    forming a second memory cell array in a cell array region of the second semiconductor layer; and
    forming a first transistor in a peripheral circuit region of the second semiconductor layer.

12. The method of claim 11, wherein forming a second memory cell array comprises forming a first impurity diffusion region, and forming a first transistor comprises forming a second impurity diffusion region, and wherein the second impurity diffusion region is formed after the first impurity diffusion region.

13. The method of claim 12, wherein the first transistor is configured to drive the first and second memory cell arrays.

14. The method of claim 12, wherein the first transistor is configured to read a data from a memory cell of first and second memory cell arrays.

15. The method of claim 11, wherein the first transistor is configured to drive the first and second memory cell arrays.

16. The method of claim 11, further comprising forming a second transistor in a peripheral circuit region of the first semiconductor layer or in a peripheral circuit region of the second semiconductor layer, the second transistor configured to operate at a higher voltage than the first transistor.

17. The method of claim 11, wherein the forming of the first memory cell array and the forming of the second memory cell array comprise:

forming a memory cell string of memory cells connected in series; and forming a string selection transistor and a ground selection transistor, the string selection transistor connected to a first end memory cell of the memory cell string, and the ground selection transistor connected to a second end memory cell of the memory cell string.

18. The method of claim 17, further comprising forming a source contact electrically connected to ground selection transistors of the first and second semiconductor layers.

19. The method of claim 17, further comprising forming a bit line electrically connected to the string selection transistors of the first and second semiconductor layers.

20. The method of claim 19, further comprising forming a local interconnection electrically connected to the first transistor when the bit line is formed.

* * * * *